(12) United States Patent
Goward

(10) Patent No.: US 10,733,930 B2
(45) Date of Patent: Aug. 4, 2020

(54) INTERPOSER FOR MULTI-LAYER DISPLAY ARCHITECTURE

(71) Applicant: Facebook Technologies, LLC, Menlo Park, CA (US)

(72) Inventor: John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 20 days.

(21) Appl. No.: 15/684,842

(22) Filed: Aug. 23, 2017

(65) Prior Publication Data

US 2019/0066571 A1 Feb. 28, 2019

(51) Int. Cl.
*H01L 33/00* (2010.01)
*G09G 3/32* (2016.01)
*H05K 3/40* (2006.01)
*H01L 23/498* (2006.01)
*G09G 3/3233* (2016.01)

(52) U.S. Cl.
CPC .............. *G09G 3/32* (2013.01); *G09G 3/3233* (2013.01); *H01L 23/49827* (2013.01); *H05K 3/40* (2013.01); *G09G 2300/0866* (2013.01)

(58) Field of Classification Search
CPC ................................................ H01L 23/49827
USPC ....................................................... 257/98, 99
See application file for complete search history.

(56) References Cited

U.S. PATENT DOCUMENTS 8,399,982 B2 * 3/2013 Wyland ................... B82Y 10/00
257/698
8,536,714 B2 * 9/2013 Sakaguchi ............ H01L 23/147
257/778
9,165,877 B2 * 10/2015 Chen .................... H01L 23/3135
9,799,622 B2 * 10/2017 Hu ........................... H01L 21/78
9,829,710 B1 * 11/2017 Newell .............. G02B 27/0172
2002/0011657 A1 * 1/2002 Saito ....................... H01L 23/13
257/700

(Continued)

FOREIGN PATENT DOCUMENTS

EP           2472577 A2    7/2012
WO    WO 2010/027962 A2    3/2010
WO    WO 2016/200882 A1   12/2016

OTHER PUBLICATIONS

Huang, Z. et al., "Metal-Assisted Chemical Etching of Silicon: A Review," Advanced Materials, 2011, pp. 285-308, vol. 23.

(Continued)

*Primary Examiner* — Tan N Tran
(74) *Attorney, Agent, or Firm* — Fenwick & West LLP

(57) ABSTRACT

A multi-layer device including device layers connected by an interposer. For example, an electronic display may include a light emitting diode (LED) layer including LEDs and a control circuitry layer to provide control signals to the LEDs. The electronic display further includes an interposer positioned between the LED layer and the control circuitry layer. The interposer includes a substrate and an array of conductive pillars extending through the substrate. The conductive pillars electrically connect the LED layer with the control circuitry layer. Bonding layers may be formed on the interposer and a corresponding side of a device layer to facilitate a hybrid bonding process that electrically connects contacts of the device layer to the conductive pillars and joins the bonding layers to attach the device layer to the interposer.

19 Claims, 14 Drawing Sheets

(56) References Cited

U.S. PATENT DOCUMENTS

| | | |
|---|---|---|
| 2006/0071344 A1 | 4/2006 | Nihei |
| 2010/0294547 A1 | 11/2010 | Hatanaka et al. |
| 2012/0168206 A1 | 7/2012 | Sekine et al. |
| 2014/0231126 A1 | 8/2014 | Hunrath et al. |
| 2017/0040306 A1 | 2/2017 | Kim et al. |
| 2019/0011652 A1* | 1/2019 | Chang .................. G02B 6/4206 |

OTHER PUBLICATIONS

Lu, C. et al., "Anodic Aluminium Oxide-based Nanostructures and Devices," Encyclopedia of Nanoscince and Nanotechnology, 2011, pp. 235-259, vol. 11.

Lee, K.W. et al., "Novel W2W/C2W Hybrid Bonding Technology with High Stacking Yield Using Ultra-Fine Size, Ultra-High Density Cu Nano-Pillar (CNP) for Exascale 2.5/3D Integration," 2016 IEEE 66$^{th}$ Electronic Components and Technology Conference, IEEE, pp. 350-355.

PCT International Search Report and Written Opinion, PCT Application No. PCT/US2018/045047, dated Nov. 28, 2018, 17 pages.

Extended European Search Report, European Application No. 18190462.4, dated Nov. 28, 2018, 10 pages.

* cited by examiner

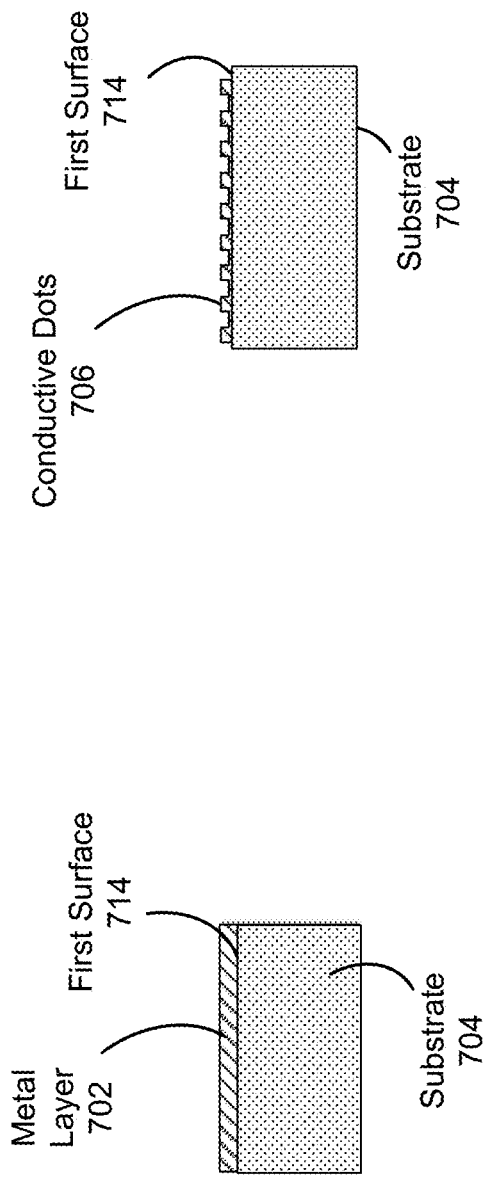
FIG. 7A
FIG. 7B

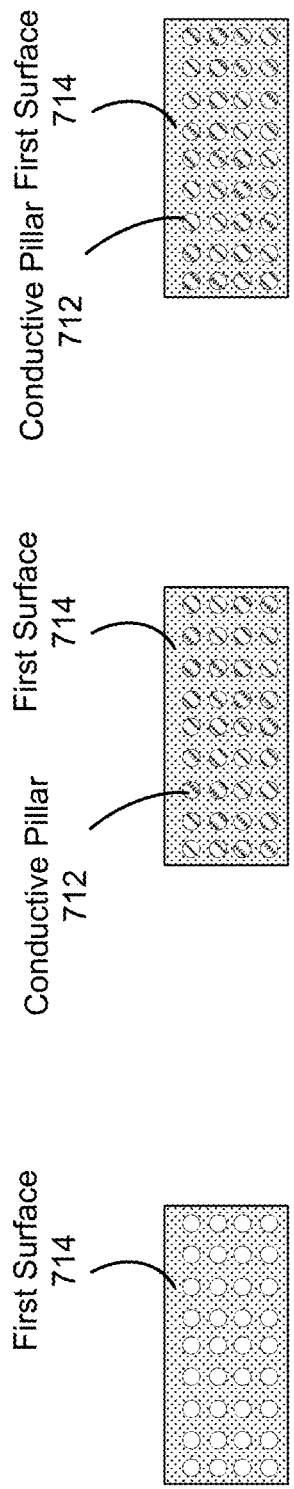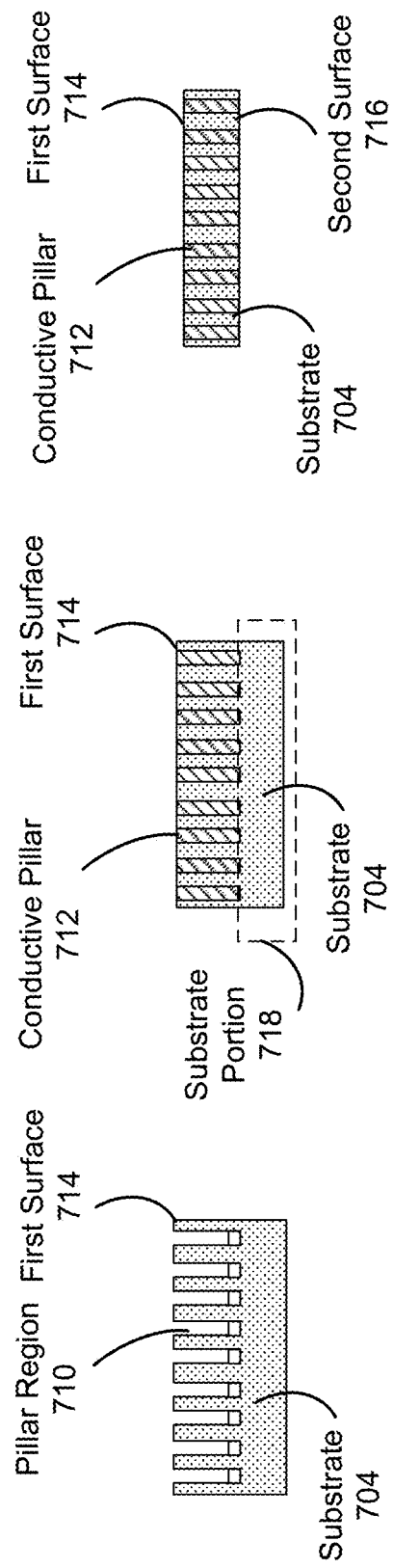

US 10,733,930 B2

INTERPOSER FOR MULTI-LAYER DISPLAY ARCHITECTURE

BACKGROUND

The present disclosure relates to an electrical interconnection that improves the thermal and mechanical properties of a final assembled component.

Electronic displays can include digital components, and analog components of different voltage levels. For example, displays may use a planar architecture where light sources, backplane electronics, and driving circuitry are positioned on the same substrate. A planar architecture can result in a large form factor, which can be undesirable in head-mounted displays, mobile devices, etc. Furthermore, placing various different types of components of the electronic display on different chips can result in performance degradation, such as may be caused by signal delays and synchronization issues between the chips. As the feature sizes becomes very small, in the range of a few microns to sub-micron, electrical conductivity decreases (increasing series resistance).

SUMMARY

Embodiments relate an electronic display having a multi-layer architecture including device layers electrically connected by an interposer. The interposer is positioned between two device layers to electrically connect the device layers, and to attach the device layers to the interposer. For example, the interposer can connect a light emitting diode (LED) layer with a control circuitry layer, or the control circuitry layer with a driver circuitry layer. The interposer includes a substrate including a first surface facing the LED layer and a second surface facing the control circuitry layer, and an array of conductive pillars extending through the substrate from the first surface to the second surface. First ends of the conductive pillars are bonded with contacts of the LED chips and second ends of the conductive pillars are bonded with contacts of the control circuitry layer to electrically connect the LED layer with the control circuitry layer.

Some embodiments include a method for manufacturing an electronic display having a multi-layer architecture of devices layers that are connected by an interposer. The interposer includes a substrate including a first surface and a second surface, and an array of conductive pillars extending through the substrate from the first surface to the second surface. The LED chips are placed on the interposer facing the first surface of the substrate to connect contacts of the LED chips with first ends of the conductive pillars, and the control circuitry layer is placed on the interposer facing the second surface of the substrate to connect contacts of the control circuitry layer with second ends of the conductive pillars. The control circuitry layer and the LED chips are bonded to the interposer. The first end of the conductive pillars are bonded with the contacts of the LED chips and the second end of the conductive pillars being bonded with the contacts of the control circuitry layer to electrically connect the LED chips with the control circuitry layer. The interposer may be bonded to the control circuitry layer and the LED chips in the same bonding process, or in separate bonding processes.

In some embodiments, the interposer is fabricated by depositing a metal layer on the first surface or the second surface of the substrate, patterning the metal layer into an array of conductive dots, etching the substrate using the conductive dots as a catalyst to form an array of pillar regions in the substrate, and forming the conductive pillars in the pillar regions.

In some embodiments, an electronic device may include a first device layer, a second device layer, and an interposer positioned between the first device layer and the second device layer. The interposer has a first surface facing the first device layer and a second surface facing the second device layer, and an array of conductive pillars extending through the substrate from the first surface to the second surface. First ends of the conductive pillars are bonded with contacts of the first device layer and second ends of the conductive pillars bonded with contacts of the second device layer to electrically connect the first device layer with the second device layer.

BRIEF DESCRIPTION OF THE DRAWINGS

FIGS. 7A, 7B, 7C, 7D, and 7E illustrate manufacturing of the interposer, in accordance with one embodiment.

The figures depict embodiments of the present disclosure for purposes of illustration only.

DETAILED DESCRIPTION

Figure 1:
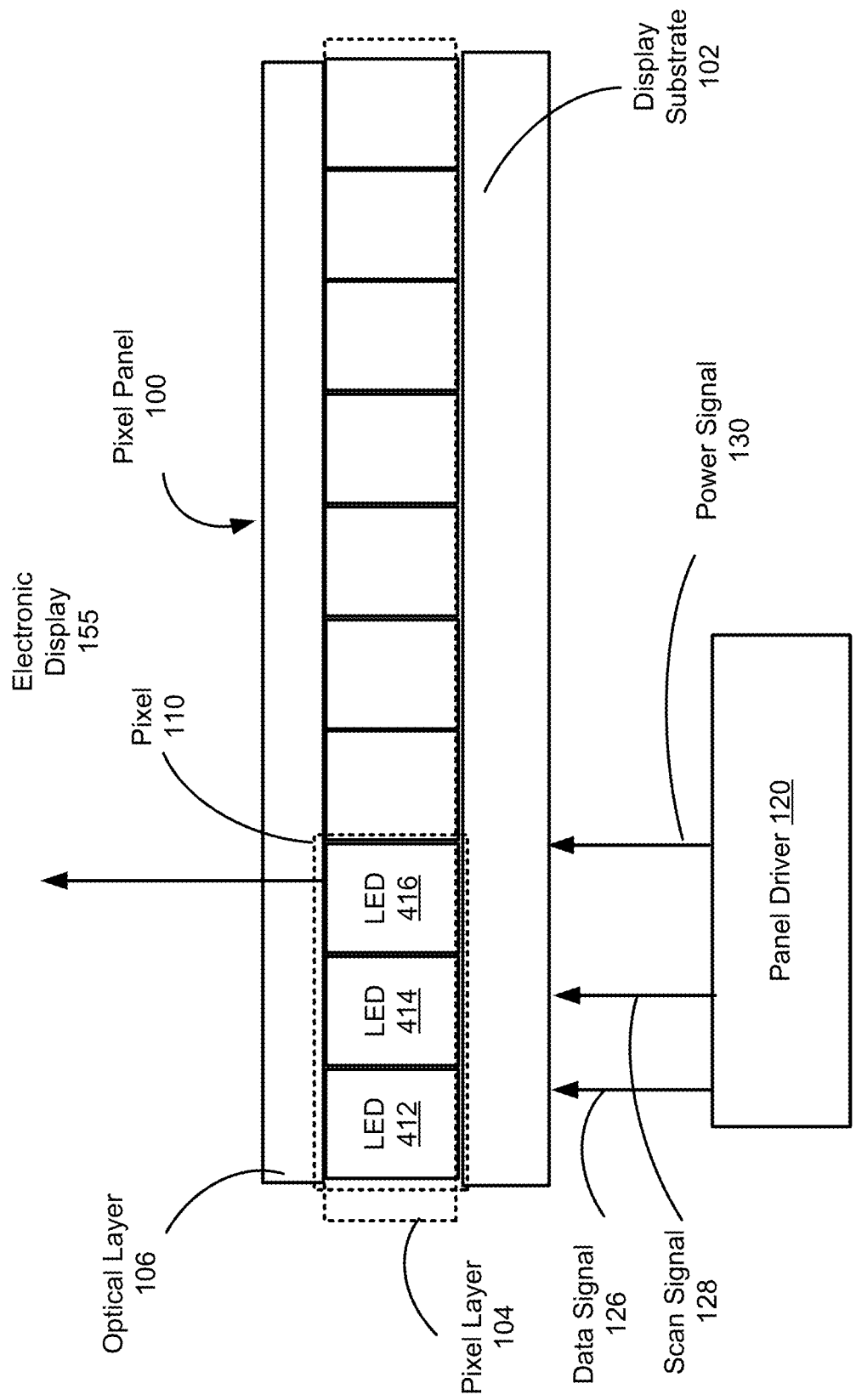
FIG. 1 is a block diagram illustrating an electronic display, in accordance with one embodiment.

FIG. 1 is a block diagram illustrating an electronic display 155, in accordance with one embodiment. The electronic display 155 has a display panel 100 including a display substrate 102 (or "substrate 102"), a pixel layer 104, and an optical layer 106. The pixel layer 104 includes an array of pixels 110 that are positioned on the display substrate 102. The pixels 110 of the pixel layer 104 emit light to provide image frames to the viewer. The display substrate 102 provides structural support for various components such as the pixels 110. The display substrate 102 further provides electrical connections via trace lines between the sub-pixel of the pixels 110 and a panel driver 120. In some embodiments, the electronic display 155 may include other types of drivers, such as a pulse-width modulation (PWM) driver that provides a pulse signal to drive the LEDs, or a calibration driver that provides data used in correcting pixel (e.g., brightness) defects. The display substrate 102 may be flexible substrate such as polymer or a rigid substrate such as a Thin Film Transistor (TFT) glass substrate, and includes the active matrix architecture.

The pixel layer 104 includes the sub-pixels that form the pixels 110. For example, a pixel 110 may include sub-pixels formed from LEDs 112, 114, and 116 respectively providing red, green, and blue color sub-pixels. Multiple sets of the LEDs 112, 114, and 116 are positioned on the display substrate 102 adjacent to each other to form a matrix of pixels 110. Each LED of each pixel 110 may emit different color light.

In some embodiments, the LEDs of each pixel 110 are each formed from a "μLED," or "micro-LED," which is a particular type of LED having a small active light emitting area (e.g., less than 2,000 μm$^2$), and collimated light output. The LEDs of the pixel layer 104 may be fabricated separately and then bonded to the display substrate 102. For example, micro-LEDs may be fabricated on a native substrate, singulated, and then transferred to the display substrate 102 to form the pixel layer 104. The micro-LEDs may be positioned on the surface of the display substrate 102, and then bonded to form electrical connections with the lines of display substrate 102 (e.g., including a TFT layer). The calibration discussed herein can be applied to micro-LEDs because their small size and assembly processes can increase the occurrence of defects, such as mura. In other embodiments, the pixel correction is applied to other types of electronic displays, including those with other types of structures such as organic light emitting diode (OLED), liquid crystal display (LCD), or inorganic light emitting diode (ILED).

The optical layer 106 may be disposed on top of the pixel layer 104. The optical layer 106 may include one or more optical elements that transmit the light emitted from the pixels 110. The optical layer 106 may include brightness enhancement films (BEFs), diffusers, polarizers, etc. The optical layer 106 can change characteristics of the light passed through the optical layer 106, such as polarization orientation, efficiency of light extraction from the display panel, etc. The optical layer 106 may also provide structural protection for the components of the pixel layer 104. In some embodiments, the optical layer 106 is omitted from the electronic display 155.

The panel driver 120 provides control signals to the display panel, such as a data signal 126, a scan signal 128, and a power signal 130. In some embodiments, the panel driver 120 may further provide a calibration signal to the pixel panel 100.

Figure 2:
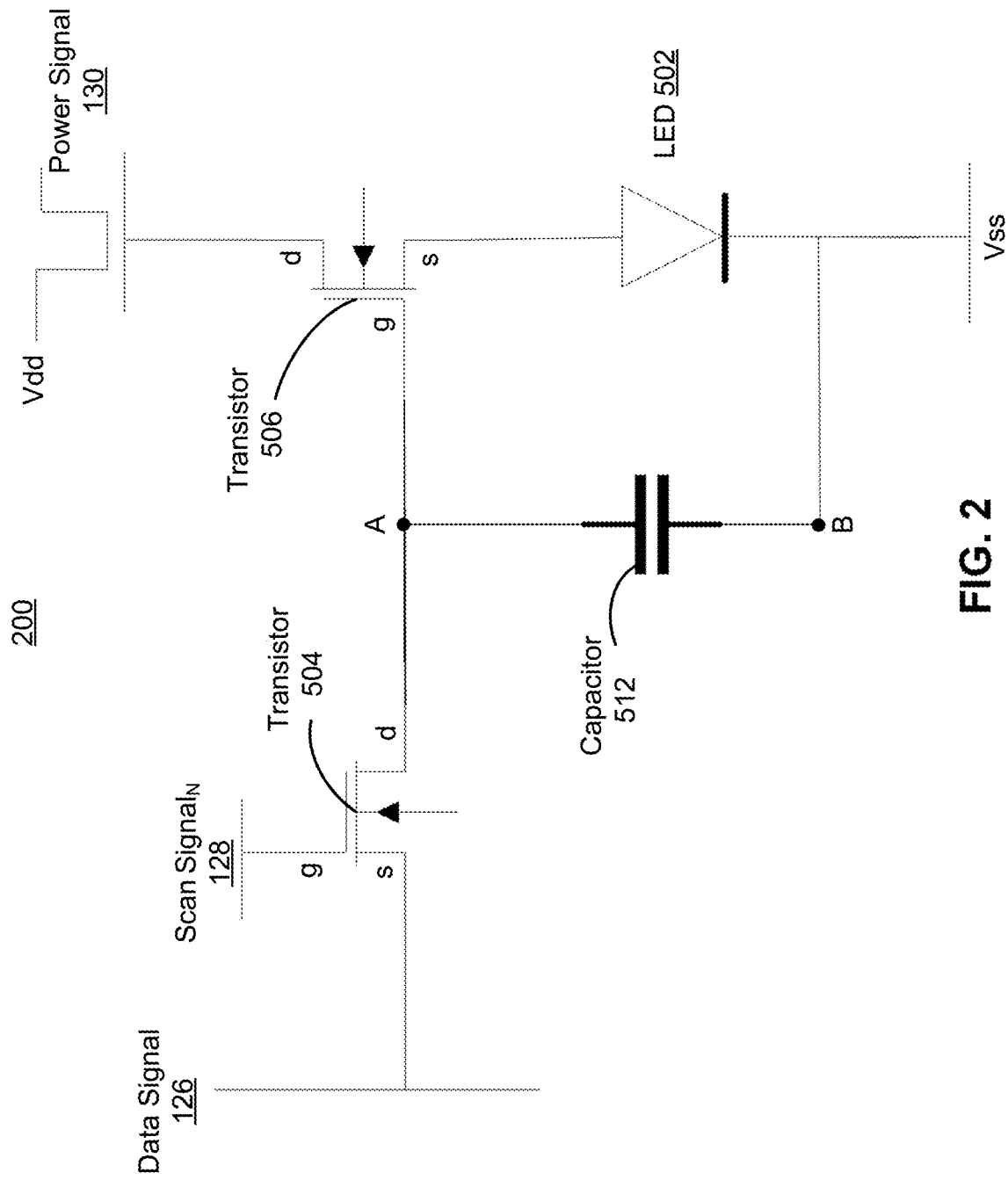
FIG. 2 is a schematic diagram of a control circuit for a sub-pixel, in accordance with one embodiment.

FIG. 2 is a schematic diagram of a control circuit 200 for a sub-pixel, in accordance with one embodiment. The electronic display 155 may include a control circuit 200 for each sub-pixel of the pixel panel 100 to control the LED 202 of the sub-pixel. The control circuit 200 may include, among other components, a transistor 204, a transistor 206, a capacitor 212, and the LED 202.

The transistor 206 is a driving transistor for the LED 202. A first terminal of the LED 202 is connected to Vss (e.g., ground or other low reference voltage) and a second terminal of the LED 202 is connected to the source of the transistor 206. The drain of the transistor 206 is connected to a PWM driver (e.g., of the panel driver 120) to receive the power signal 130, which may be a PWM signal. The gate of the transistor 206 is connected at a node A with a first terminal of the capacitor 210 and the drain of the transistor 204. The source of the transistor 204 is connected to the panel driver 120 to receive the data signal 126, and the gate of the transistor 204 is connected to the panel driver 120 to receive scan signal$_N$ 128. The scan signal$_N$ refers to the scan signal for a row that includes the sub-pixel of the control circuit 200 shown in FIG. 2. The first terminal of the LED 202 is further connected to node B with the second terminal of the capacitor 210 and Vss. The control circuit 200 is only an example embodiment of a control circuit that can be used for each sub-pixel and other types of pixel control circuitry can be used.

Figure 3:
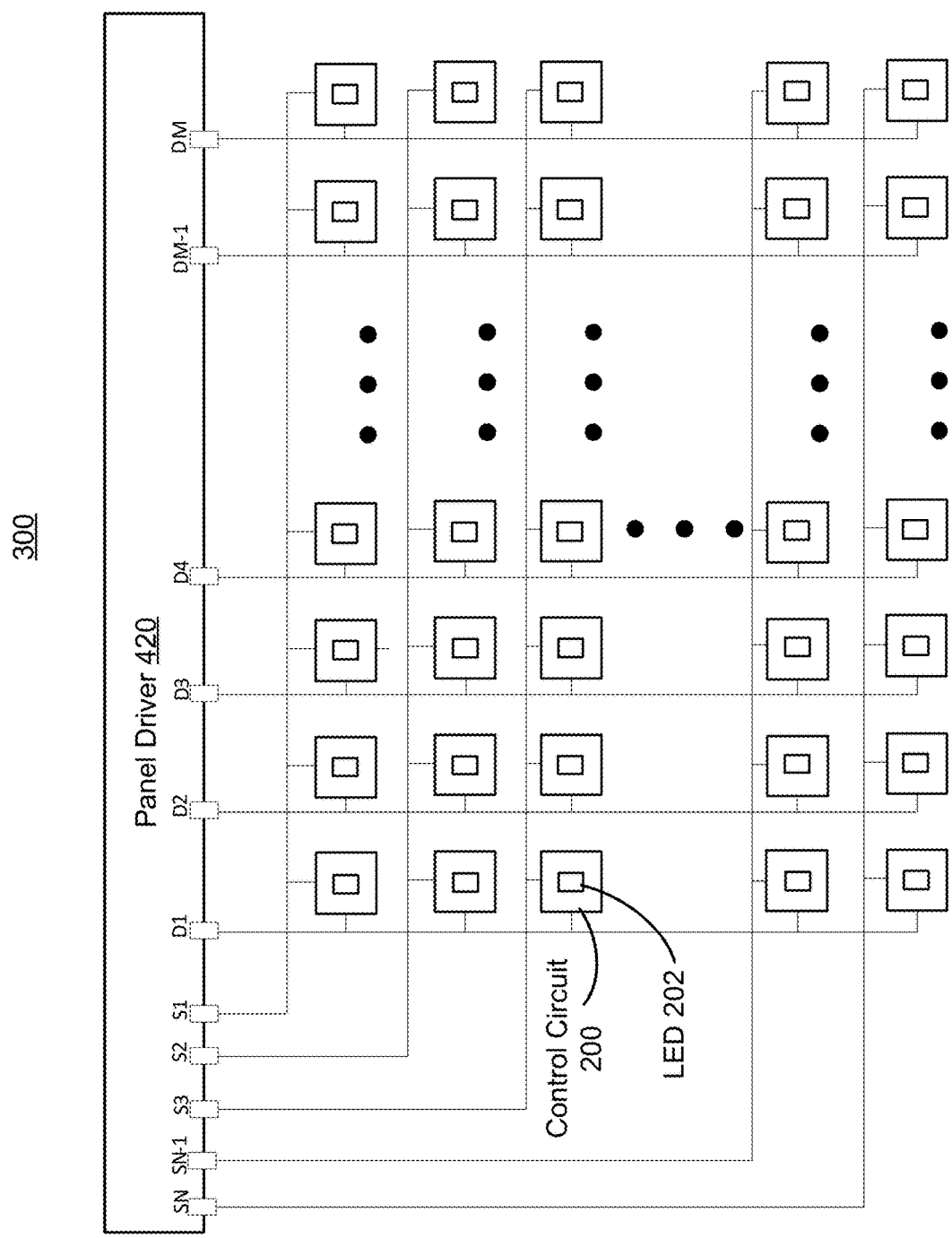
FIG. 3 is a block diagram of a control system for the electronic display, in accordance with one embodiment.

FIG. 3 is a block diagram of a control system 600 for the electronic display 155 including control circuits 200, in accordance with one embodiment. The electronic display 155 includes an array of pixels, such as M columns×N rows of pixels. The pixel resolution, such as the column size, of the electronic display may vary. Each pixel includes multiple sub-pixels, such as a red color sub-pixel including a red color LED, a blue color sub-pixel including a blue color LED, and a green color sub-pixel including a green color LED. Each of the sub-pixel types may be controlled by a control system 600. For example, the control system 600 includes M columns of sub-pixels×N rows of sub-pixels. The rows of sub-pixels are controlled by the scan lines S1 through SN connected to the panel driver 120. Each row of pixels includes pixels P1 through P1920. The panel driver 120 provides the scan signals 128 to the rows of sub-pixels via the scan lines S1 through SN. The panel driver 120 provides the data signals 126 to columns of sub-pixels via the data lines D1 through DM. In some embodiments, a PWM driver and/or calibration driver is connected to each of the control circuits 200.

The electronic display 155 can include a multi-layer structure that includes the drivers, control circuits for LEDs, and the LEDs formed on separate layers and stacked on top of each other. The multi-layer structure reduces form factor for the electronic display 155 and improves performance of the electrical interconnections between components. Each sub-pixel has an LED 202 and a control circuit 200. The control circuits 200 are analog components that provide voltages and currents that drive the LEDs 202. The panel driver 120 (and any other drivers) are digital components that provide digital voltage levels to the control circuits 200. In some embodiments, the LEDs 202, analog components including control circuits 200, and digital components including the panel driver 120 are located in different layers of a multi-layer structure of the electronic display 155, and interconnected by interposers.

Figure 4:
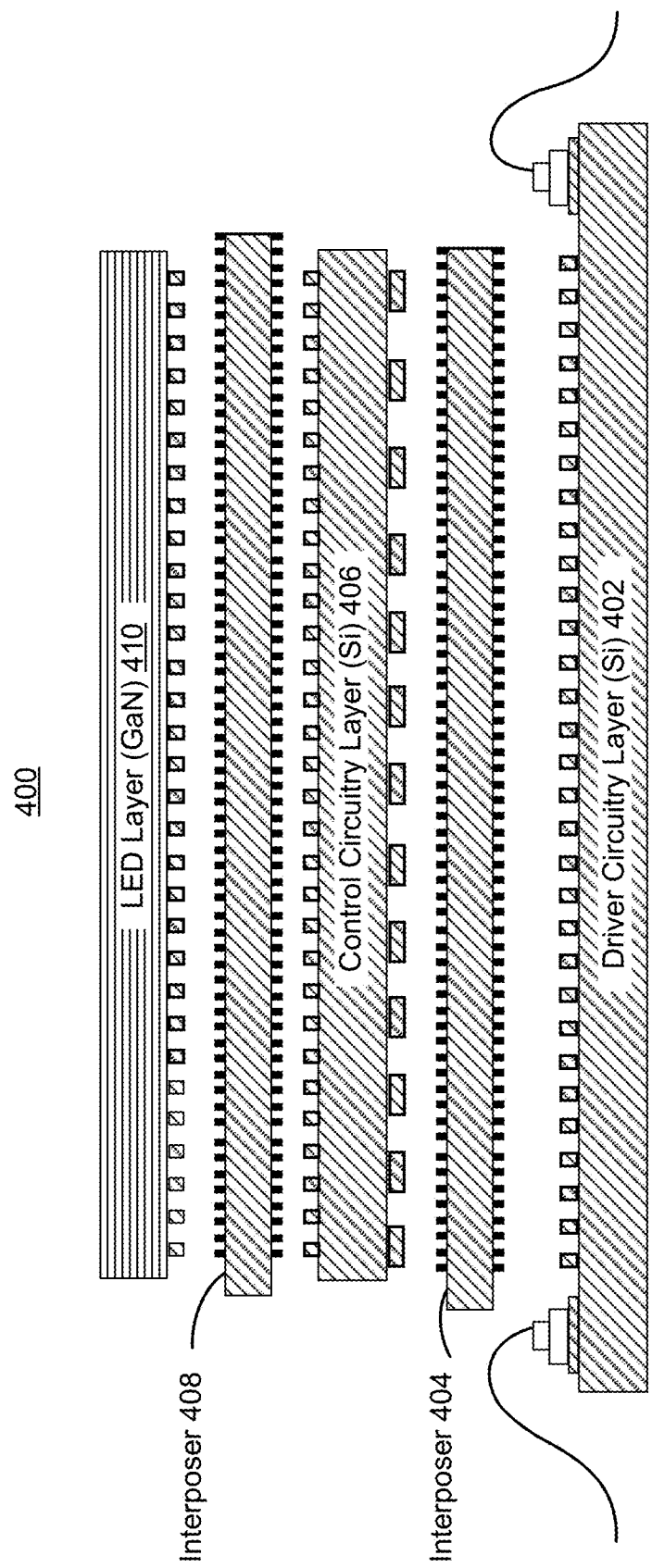
FIG. 4 is a schematic diagram of a side view of a multi-layer structure of the electronic display, in accordance with one embodiment.

FIG. 4 is a schematic diagram of a side view a multi-layer structure 400 of an electronic display, in accordance with one embodiment. The multi-layer structure 400 may include, among other components, a driver circuitry layer 402, an interposer 404, a control circuitry layer 406, an interposer 408, and an LED layer 410. The interposers 404 and 408 form electrical interconnections between adjacent layers. The interposer 404 is positioned between the driver circuitry layer 402 and the control circuitry layer 406. The interposer 408 is positioned between the control circuitry layer 406 and the LED layer 410.

The LED layer 410 may include an array of LEDs, and forms the pixel layer 104 of the electronic display 155. In some embodiments, the LEDs are micro-LEDs including gallium nitride (GaN) layers on a sapphires substrate. In other examples, the micro-LEDs include other types of substrates such as a silicon carbide (SiC), GaN, or silicon (Si) substrate.

The driver circuitry layer 402 uses signals for data loading and processing, and digital voltage levels. The driver circuitry layer 402 may include the panel driver 120, and may further include one or more other types of drivers for the electronic display 155. The driver circuitry layer 402 is fabricated separately from the other layers of the multi-layer structure. In some embodiments, the driver circuitry layer 402 is fabricated using a silicon (Si) substrate. The type of drivers defined in the driver circuitry layer 402 may vary. For example, the driver circuitry layer 402 may include a pulse-width modulation driver or a non-pulsed driver to power the control circuits 200 of the control circuitry layer 406. In another example, the calibration driver may be omitted if calibration is not needed.

The control circuitry layer 406 defines control circuits 200 for the LEDs in the LED layer 410. In particular, the transistors 204 and 206, the lines for the data signal 126, scan signal 128, and power signal 130, and the capacitor 212 of the control circuit 200 for each sub-pixel may be defined in the control circuitry layer 406. The control circuitry layer 406 uses analog voltage levels that drive the LEDs in the LED layer 410. In some embodiments, the control circuitry layer 406 is fabricated using a silicon (Si) substrate.

The interposer 404 provides electrical interconnections between the driver circuitry layer 402 and the control circuitry layer 406. The interposer 408 provides interconnections between the control circuitry layer 406 and the LED layer 410. Different device layers of the multi-layer structure 400 may be fabricated separately, and in some embodiments using different processes, and are then stacked to achieve a desirable form factor. For example, the LED layer 410, driver circuitry layer 402, and control circuitry layer 406 may be fabricated separately, and then joined and electrically interconnected by the interposers 404 and 406. In this way, each device layer can be optimized to combined best performance with best form factor. In some embodiments, the multi-layer structure 400 includes only a single interposer 404 or 408, and some of the adjacent layers may be joined without an interposer.

In other embodiments, a layer including vertical-cavity surface-emitting lasers (VCSELs) may be used instead of the LED layer 410. In such case, the layer including VCSELs may be connected to the interposer 408. The VCSELs may include vias that provide interconnections between the interposer 408 and contacts at the light emitting side of the VCSELs.

Figure 5:
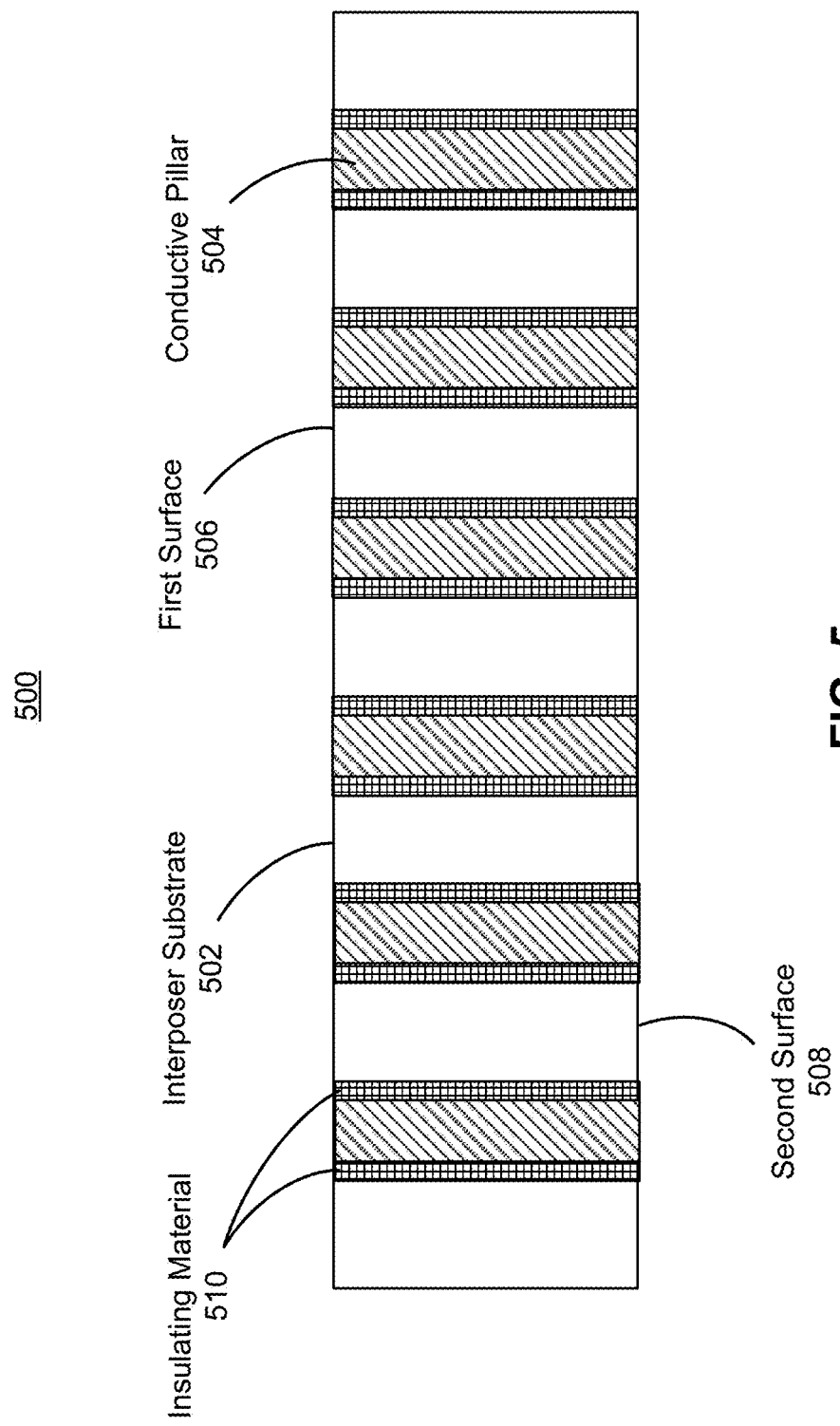
FIG. 5 is a side view of an interposer for interconnecting two devices of the electronic display, in accordance with one embodiment.

FIG. 5 is a cross sectional side view of an interposer 500, in accordance with one embodiment. The interposer 500, like other examples of interposers discussed herein, is an example of an interposer 404 or 406 that joins two layers of the multi-layer structure 400 to form an electronic display 155. The interposer 500 includes an interposer substrate 502 and an array of conductive pillars 504. Each conductive pillar 504 extends through the substrate from the first (e.g., top) surface 506 to the second surface 508. The substrate 502 provides electrical isolation and structural support for the conductive pillars 504. The conductive pillars 504 form conductive paths through the substrate 502 for signals between a first layer positioned along the first surface 506 and a second layer positioned along the second surface 508. In some embodiments, an insulating material 510 surrounds each conductive pillar 504 to improve electrical isolation between the substrate 504 and the conductive pillars 504. In some embodiments, the conductive pillars 504 are uniformly spaced apart from each other.

Figure 6:
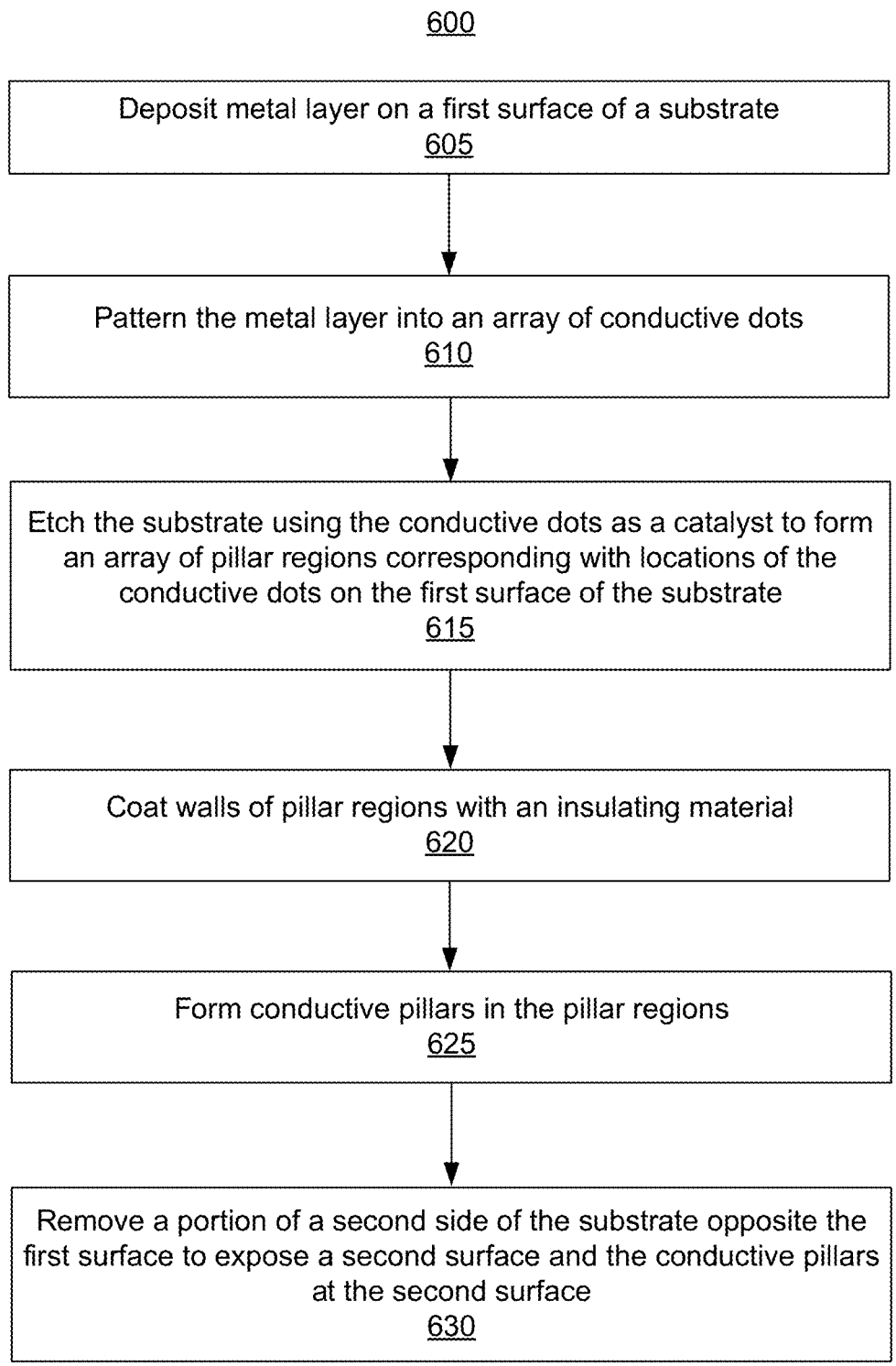
FIG. 6 is a flow chart of a process for manufacturing an interposer, in accordance with one embodiment.

FIG. 6 is a flowchart of a process 600 for manufacturing an interposer, in accordance with one embodiment. Process 600 is discussed with reference to FIGS. 7A through 7E, which illustrate the manufacturing of the interposer each from a top and side view.

A metal layer is deposited 605 on a first side of a substrate. The substrate may be a silicon substrate. The metal layer may include a noble metal such as gold, copper, or some other suitable metal. The metal layer may be deposited using various techniques, such as a chemical or physical deposition. With reference to FIG. 7A, the metal layer 702 is deposited on a first (e.g., top) side of a substrate 704.

The metal layer is patterned 610 into an array of conductive dots on the first surface of the substrate. For example, the metal layer 702 is patterned into the array of conductive dots using a lithographic process. With reference to FIG. 7B, the array of conductive dots 706 is formed on the first surface 714 of the substrate 704 from the metal layer 702. The dot may have a circular shape as shown, or may include some other shape such as hexagonal, or other shape providing high packing density on the surface of the substrate 704.

The substrate is etched 615 using the conductive dots as a catalyst to form an array of pillar regions in the substrate corresponding with locations of the conductive dots on the first surface of the substrate. With reference to FIG. 7C, the pillar regions 710 are recesses formed at the first surface 714 of the substrate 704 at locations of the conductive dots 706. In some embodiments, a metal assisted etch (MacETCH) process is used to form the pillar regions 710. The MacETCH process includes performing a catalytic etch of the silicon substrate beneath the conductive dots 706 in the presence of hydrofluoric acid and an oxidative agent. The portions of the substrate 704 that are covered by the conductive dots 706 are etched while other portions of the substrate 704 that are not covered by the conductive dots 706 are not etched to form the array of pillar regions 710.

The pillar regions 710 may be holes or recesses defined at the first surface 714 of the substrate 704. In this intermediate manufacturing stage, the pillar regions 710 extend into but not fully through the thickness of the substrate 704 as shown in FIG. 7C. In another example, the pillar regions 710 may be vias that extend through the entire thickness of the substrate 704. The pillar regions 710 may be uniformly spaced apart in accordance with the array of conductive dots 706. In some embodiments, each pillar region 710 defines a diameter between 60 to 100 nanometers. The height each pillar region 710 defined from the first surface 714 to the bottom of the pillar region 710 may be between 50 to 100 micrometers.

In some embodiments, the pillar regions 710 are formed in the substrate 704 using a laser drilling or a plasma etching process, or some other suitable process. Here, the steps 605-615 of the process 600 using the MacETCH process may be omitted from the process 600. The laser drilling or plasma etching results in pillar regions having a diameter that is less than 10 micrometers.

The walls of the pillar regions are coated 620 with an insulating material. With reference to FIG. 5, the insulating material 510 may be an insulating barrier film such as silicon oxide, or some other dielectric material. In another example, the insulating material is polymeric material. The insulating material can be deposited on the walls of the etched pillar regions using various deposition processes. In some embodiments, the substrate 704 is placed in an oxidation furnace to form a thin silicon oxide layer. In other embodiments, a chemical vapor deposition (CVD) may be used to form a layer of the insulating material. The thickness of the insulating material may be in the order of one or a few micrometers.

In some embodiments, the insulating material is deposited using atomic layer deposition (ALD) to form a film having a thickness in the order of a few nanometers. ALD can be used for smaller feature sizes for the conductive pillars and/or for a more closely packed array of conductive pillars.

Conductive pillars are formed 625 in the array of pillar regions in the substrate. The conductive pillars 712 provide electrical pathways that are isolated from each other by the substrate 104. With reference to FIG. 7D, the conductive pillars 712 are disposed in the pillar regions 710 defined in the substrate 704. In some embodiments, the conductive pillars 712 are formed in the pillar regions 710 using a metal plating process. The first surface 714 of the substrate 704 may be polished to ensure electrical isolation of each conductive pillar 712 subsequent to the plating process.

The conductive pillars 712 may be formed using a conductive material such as copper. In some embodiments, carbonaceous elements such as carbon nanotube (CNT) filaments are incorporated with the metal to form the conductive pillars 712. For example, CNT filaments may be introduced during the metal plating process that forms the conductive pillars 712 in the pillar regions 710. The CNT filaments may be deposited with the metal simultaneously because of covalent bonding between the CNT filaments and the metal, such as gold. The CNT filaments may be arranged in a random orientation with an occasional crossing point to other CNT filaments. The diameter (or feature size) of each conductive pillar 712 being small (e.g., 60-100 nm in diameter) results in low electrical current and thermal conductance, and thus introduction of the CNT filaments into the conductive pillars 712 improves the electrical and thermal properties of the conductive pillars 712. Thus, the conductive pillars 712 may include the CNT filaments to offset effects caused by small feature size in the interposer.

In some embodiments, prior to the metal plating of the conductive pillars 712, a diffusion barrier layer is coated on the surface of the insulating material 504, or on the side walls of the substrate 704 defining the pillar regions 710 if no dielectric material is used. A metal such as copper can have a high diffusion rate through silicon or silicon dioxide, and thus the diffusion barrier layer may be deposited to reduce or prevent the diffusion of the metal into the substrate 704 or insulating material 504 during metal plating. In some embodiments, the diffusion barrier layer is formed from titanium tungsten (TiW).

A portion of a second side of the substrate opposite the first surface is removed 630 to expose a second surface and the conductive pillars at the second surface. For example, if the pillar regions 710 extend only partially into the substrate 704 from the first surface 714 as shown in FIG. 7D, then the portion 718 of the substrate 704 where the pillar regions 710 fail to extend may be removed from the substrate 704 to expose the pillar regions 710 and the second (e.g., bottom) surface 716. With reference to FIG. 7E, a first end of each conductive pillar 712 is exposed at the top surface 714, and removing the substrate portion reveals the other end of the conductive pillars 712 at the second surface 716 of the substrate 704. Each conductive pillar 712 extends from the top surface 714 to the second surface 716 of the substrate 704.

In some embodiments, each pillar regions is defined by sloping side walls in the substrate 704, and thus includes different diameters along the length of each pillar region. The conductive pillars are formed in the pillar regions have a corresponding shape, with one end having a larger diameter than the other end. Here, the conductive pillars may be used to connect device layers having differently sized and/or pitched contacts.

An alternative approach to manufacturing an interposer using the process 600 may include etching aluminium thin sheets to form Anodic Aluminium oxide (AAO). While thin nano-pillar structures can be plated in the AAO structure, handling of this thin membrane can be difficult. Among other advantages, the process 600 can be used to manufacture a thin wafer element to be used as an intermediate bonding layer and that can be more readily handled using wafer thinning processes and temporary wafer transport processes. AAO metallic structures may incorporate metals with magnetic properties. The features formed by the AAO process are generally self-organising, producing hexagonal spaced pores. This has the potential to limit the flexibility of the size and shape as well as the array spacing of the metal features that would be subsequently formed by plating. The array of conductive pillars 712 formed using the process 600 can have flexible size, shape and pitch using lithographic or other imaging processes.

Figure 8:
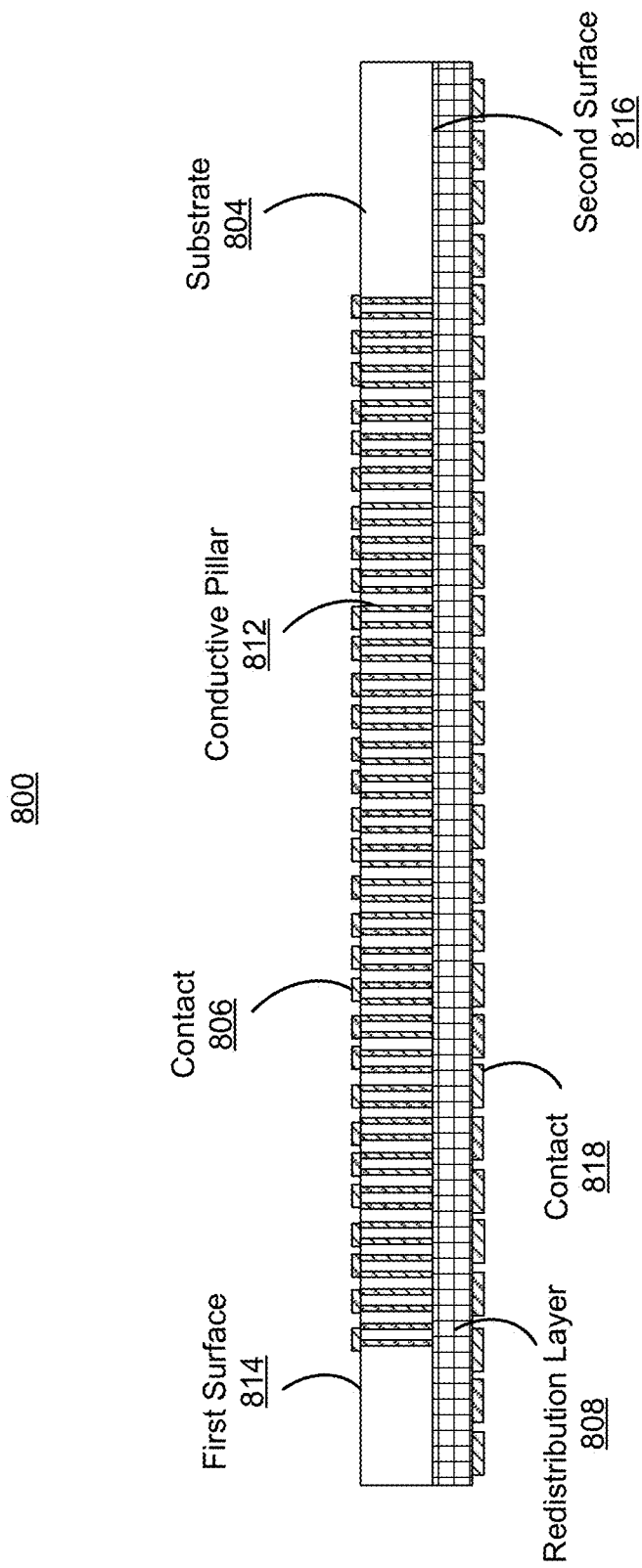
FIG. 8 is a side view of an interposer, in accordance with one embodiment.

FIG. 8 is a side view of an interposer 800, in accordance with one embodiment. After the conductive pillars are formed in the substrate of the interposer and exposed at the first and second surfaces, additional processing can be performed at the first or second surface to form contacts. For example, the interposer 800 includes contacts 806 formed on the first surface 814. Each contact 806 can electrically connected two or more adjacent conductive pillars 812 at the first surface 814. The contacts 806 may be used to provide small pitch metal contacts.

Another process that can be performed at the first or second surface is shown at the second surface 816, where a redistribution layer (RDL) 808 is formed. The redistribution layer 808 connects the conductive pillars 812 at the second surface 816 of the substrate to contacts 818. Each contact 818 may be electrically connected with one or more of the conductive pillars 012. The redistribution layer 008 makes the contacts 818 available at different locations from the location of the conductive pillars 812 at the second surface 816. Thus, the redistribution layer 808 can provide contacts of different sizes and different pitch between adjacent contacts 818. In some embodiments, the redistribution layer 808 provides for large pitch metal contacts 818 (e.g., relative to the small pitch contacts 806 formed without the redistribution layer 808). In some embodiments, each of the first surface 814 and the second surface 816 includes contacts having size and pitch that correspond with the size and pitch of contacts of layers joined by the interposer 800. In some embodiments, the redistribution layer 808 is formed using back end of line (BEOL) metallization processes, such as using dual damascene processing for the deposition of copper traces and vias simultaneously.

Figure 9:
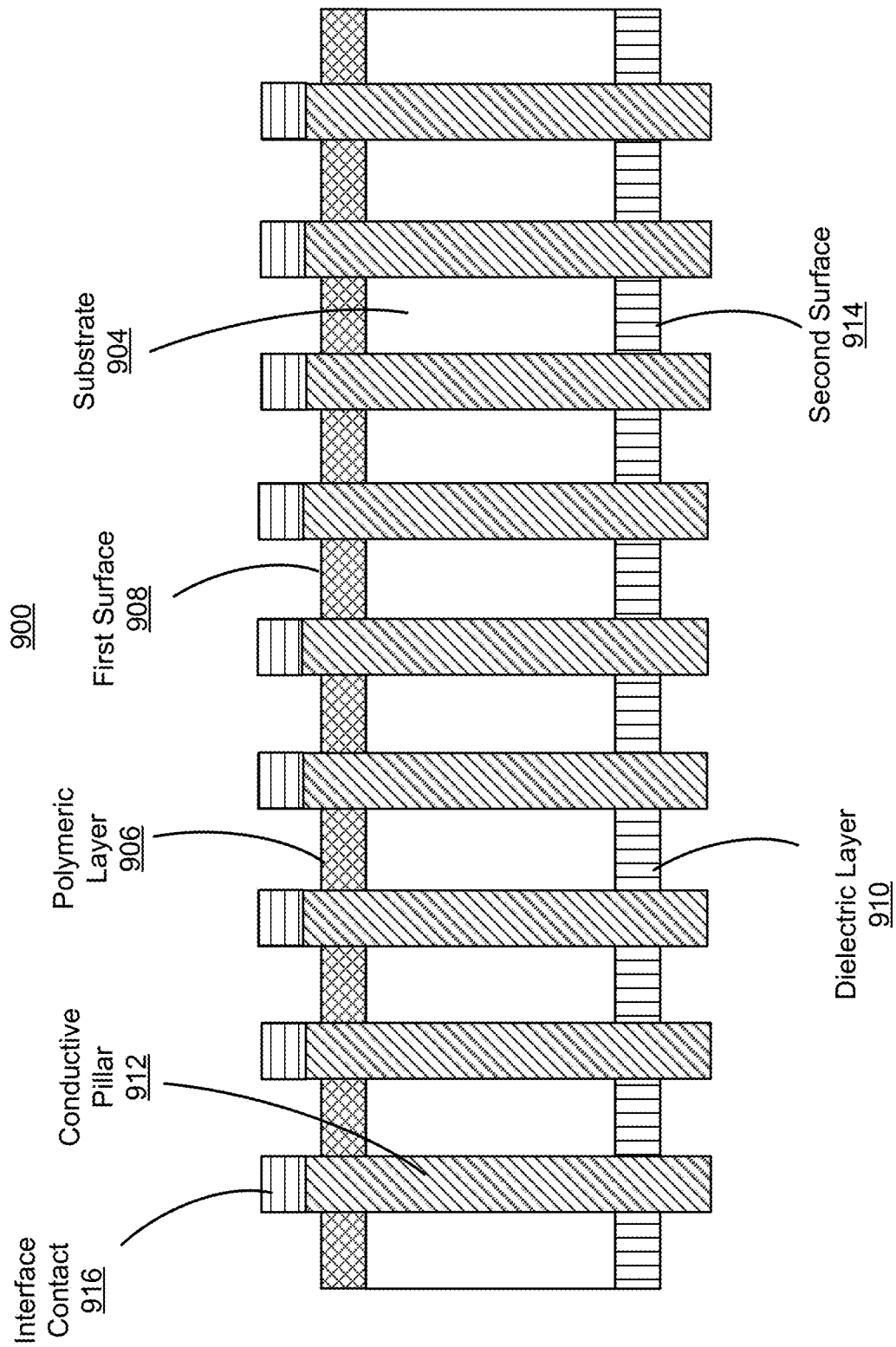
FIG. 9 is a side view of an interposer with different surface materials electrically connecting devices, in accordance with one embodiment.

FIG. 9 is a side view of an interposer 900, in accordance with one embodiment. The interposer 900 may include a bonding layers at each surface to facilitate joining with a device layer. A bonding layer can include a material can be deposited at the first or second surface of an interposer to facilitate bonding with device layers of different types of materials. An interposer may include bonding layers formed from dielectric materials deposited between protruding conductive pillars formed by etching of the (e.g., Si) substrate at one or more of the surfaces.

For example, the interposer 900 includes a polymeric layer 906 forming a first surface 908 on the substrate 904, and a dielectric layer 910 forming a second surface 914 on the substrate 904 opposite the first surface 908. The polymeric layer 906 and dielectric layer 910 are examples of bonding layers that that can be deposited on a surface of the substrate 904 to facilitate joining with a device layer at the surface. The polymeric layer 906 may be formed by etching away the substrate 904 to expose a protruding portion of the conductive pillars 912, and then depositing the polymeric layer 906 on the etched surface of the substrate 904 around the conductive pillars 912. The deposition may be performed using lamination, spin coating, or some other suitable process. The dielectric layer 910 may include silicon oxide or oxynitride, or other type of dielectric material. Formation of the dielectric layer 910 may be achieved using various deposition processes, such as chemical vapor deposition (CVD). The dielectric layer 910 may be formed by etching away the substrate 904 to expose a protruding portion of the conductive pillars 912, and then depositing the dielectric layer 910 on the etched surface of the substrate 904 around the conductive pillars 912.

In various embodiments, an interposer may include one or more bonding layers that facilitate joining with a device layer. For example, both surfaces of the interposer may include the same material bonding layer, or may include different types of bonding layers.

The interposer 900 further includes interface contacts 916 formed on the conductive pillars 912 at the first surface 908. The interface contacts 916 are a different material from the conductive pillars 912, and are used to modify the interface material that binds to the contacts of a device layer. For example, the conductive pillars 912 may be formed from copper while the interface contacts 916 may be formed from tin (Sn) to change the joining process attributable to each surface. For example, the addition of Sn plating to the copper surface of the conductive pillars 912 can alter the temperature at which the interface is bonded with a device layer. An interposer may include interface contacts on one or more ends of the conductive pillars as suitable to facilitate bonding with a device layer at the desirable temperature.

Although not shown in FIG. 9 to avoid overcomplicating the disclosure, the interposer 900 may include insulating material surrounding the conductive pillars 912, a redistribution layer, or various other features of the interposers discussed herein. The features of an interposer can be optimized based on the properties of device layers bonded to the interposer to provide electrical connection and mechanical attachment for flexible configurations of the device layers.

Figure 10:
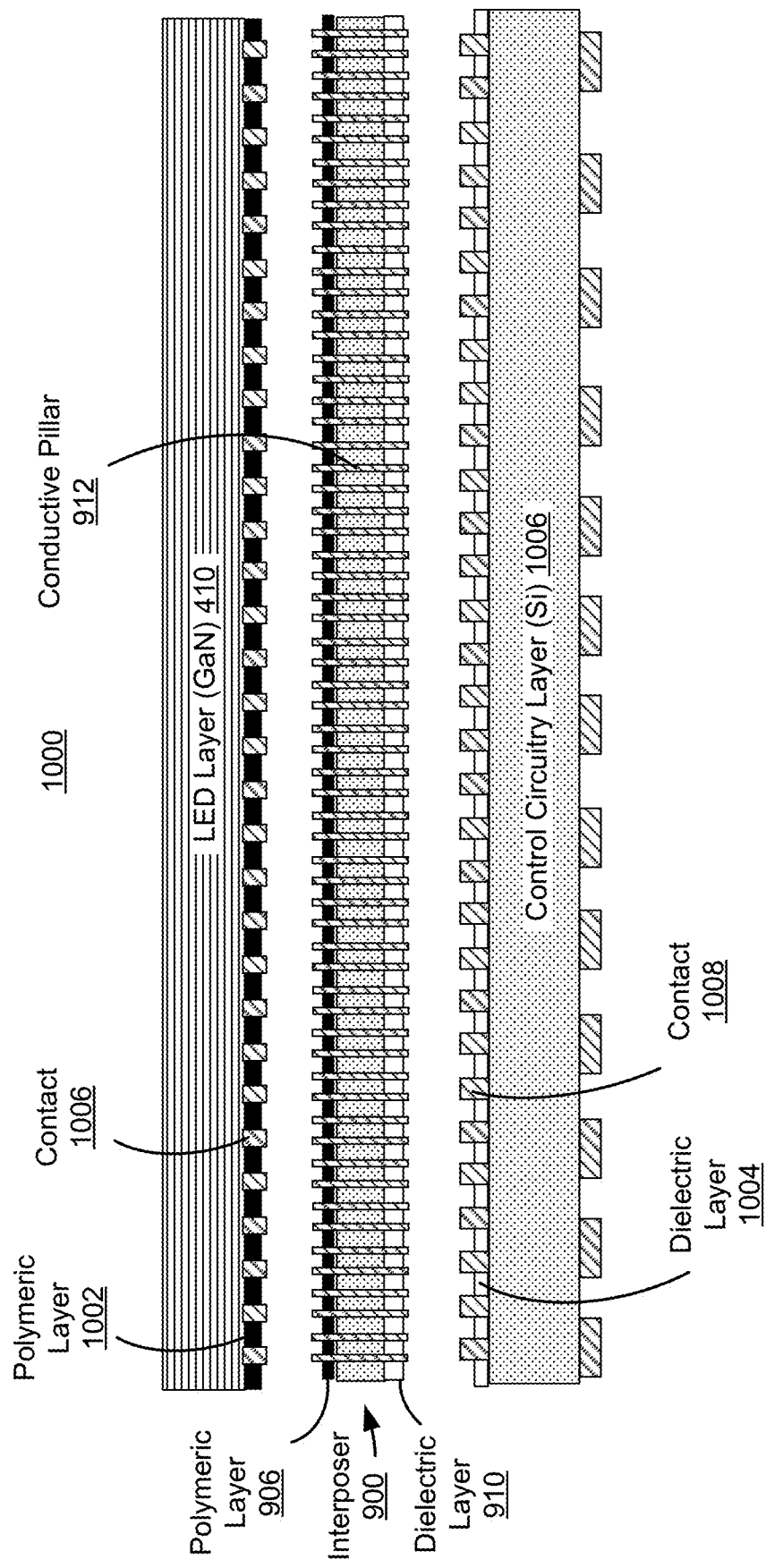
FIG. 10 is a side view of a multi-layer structure of the electronic display, in accordance with one embodiment.

FIG. 10 is a side view of a multi-layer structure 1000 of the electronic display 155, in accordance with one embodiment. The multi-layer structure 1000 includes the interposer 900 joining an LED layer 1010 and a control circuitry layer 1006. The LED layer 1010 and control circuitry layer 1006 are examples of device layers that can be joined by the interposer 900.

The LED layer 1010 includes a polymeric layer 1002 that is joined with the polymeric layer 906 of the interposer 900. The same material or a similar material as the polymeric layer 906 is deposited on the adjacent surface of the LED layer 1010 including contacts 1006 to facilitate bonding of the LED layer 11010 with the interposer 900. The LED layer 1010 may include a semiconductor material such as III-V type material (e.g., GaN), which is a different material from the silicon material of the control circuitry layer 1006.

The control circuitry layer 1006 includes a dielectric layer 1004 that is joined with the dielectric layer 910 of the interposer 900. The same material or a similar material as the dielectric layer 910 is deposited on the adjacent surface of the control circuitry layer 1006 including contacts 1008 to facilitate bonding of the control circuitry layer 1006 with the interposer 900. For example, the control circuitry layer 1006 may be a silicon complementary metal-oxide-semiconductor (CMOS) silicon wafer. Here, the dielectric layer 1004 is a silicon oxide or an oxynitride layer adjacent to the contacts 1008 on the surface that join with the interposer 900.

The interposer 900 is joined with the LED layer 1010 and the control circuitry layer 1006 in a hybrid bonding process. This results in the GaN of the LED layer 1010 being connected with the silicon of the control circuitry layer 1006 to drive the LEDs of the LED layer 1010. During a hybrid bonding process, the contacts 1006 of the LED layer 1010 are electrically bonded with a first end of the conductive pillars 912 of the interposer 900 in a direct bonding (e.g., copper-copper), and the polymeric layer 906 of the interposer 900 is bonded with the polymeric layer 1002 of the LED layer 1010. A combination of copper-copper direct bonding and polymer layer adhesion results in the interposer 900 and the LED layer 1010 being bonded together.

Furthermore, the contacts 1008 of the control circuitry layer 1006 are electrically bonded with a second end of the conductive pillars 912 in a direct bonding, and the dielectric layer 910 of the interposer 900 is bonded with the dielectric layer 1004 of the control circuitry layer 1006. A combination of copper-copper direct bonding and bonding between dielectric layers results in the interposer 900 and the control circuitry layer 1006 being bonded together.

In some embodiments, the hybrid bond process occurs at room temperature or an elevated temperature (e.g., but below 200° C.), and with pressure applied to the interface. In some embodiments, a single hybrid bonding process is performed to join the interposer 900 with the LED layer 1010 and the control circuitry layer 1006. The bonding of all surfaces is performed simultaneously after alignment of all the device layers with the interposer. In other embodiments, different sides of the interposer 900 are bonded with a corresponding device layer in different hybrid bonding processes. If two hybrid bonding processes are used, one process may be at a different temperature or different amount of pressure applied relative to the other process.

Figure 11:
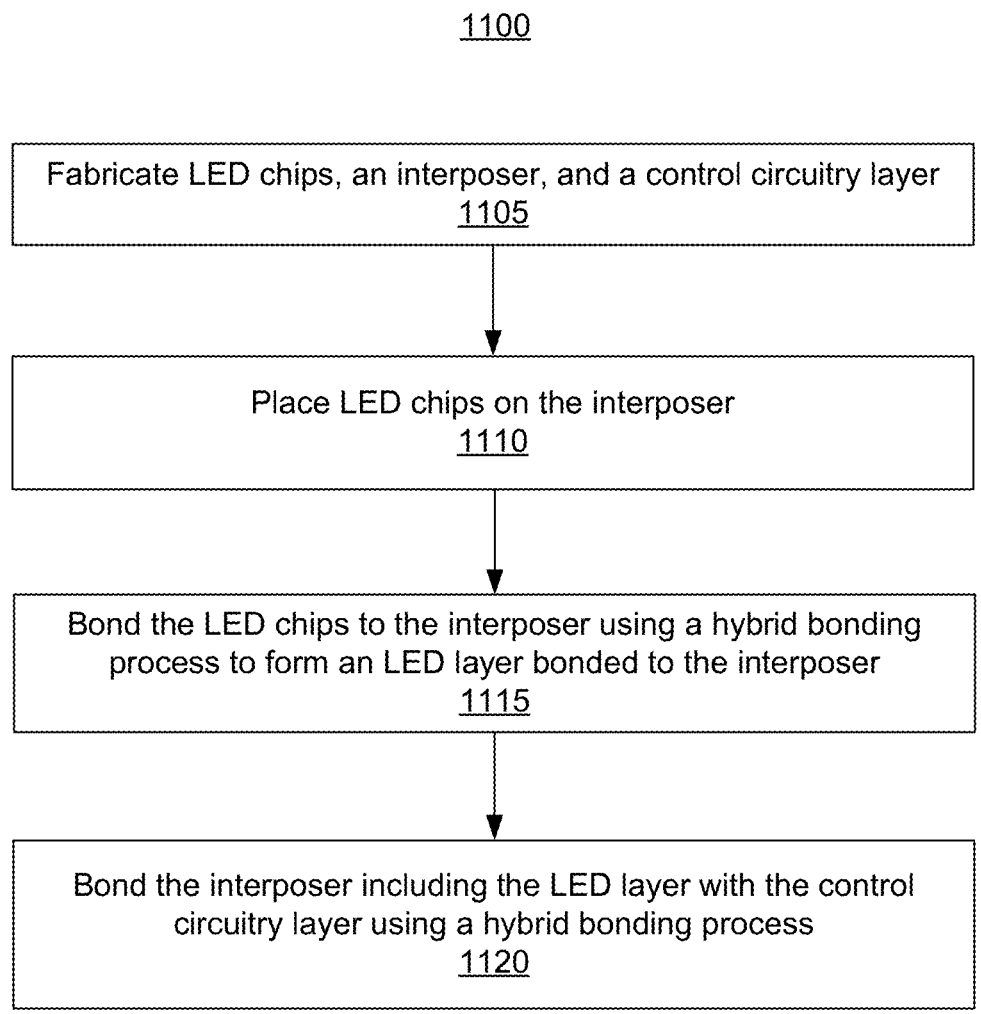
FIG. 11 is a flow chart of a process for manufacturing a multi-layer structure of FIG. 10, in accordance with one embodiments.

FIG. 11 is a flow chart of a process 1100 for manufacturing a multi-layer structure 1000 of FIG. 10, in accordance with one embodiments. The process 1100 uses an interposer as a carrier substrate for assembling LED chips to a control circuitry layer. Process 1100 is discussed with reference to FIGS. 12A, 12B, and 12C, which illustrate the manufacturing of the multilayer structure 1000, in accordance with one embodiment.

The process 1100 may be used to join two or more device layers that may be manufactured using dissimilar materials with an interposer including an array of conductive pillars having extremely small feature sizes. Each conductive pillar may be in the order of 10's of microns in diameter size, or significantly smaller (e.g., sub-micron feature size). If the device layers to be joined are large in dimensions, relative to the size of the conductive pillars, then maximum or optimal bonding temperature may be affected by the material composition of the conductive pillars. If the bonding process temperature is too high, this can cause thermal walk-off leading to the failing of forming metallic interconnects. It is desirable that the bonding process can provide a 100% interconnect yield for multiple (e.g., millions) of connections being made simultaneously. One cause of the thermal walk-off is coefficient of thermal expansion (CTE) differences of the two surfaces to be electrically connected together. Therefore, it can be advantageous to use a low temperature bonding process and matched CTE interfaces to mitigate assembly problems. Therefore, in conjunction with the conductive pillars, bonding layers may be used to join device layers to the interposer.

Figure 12A:
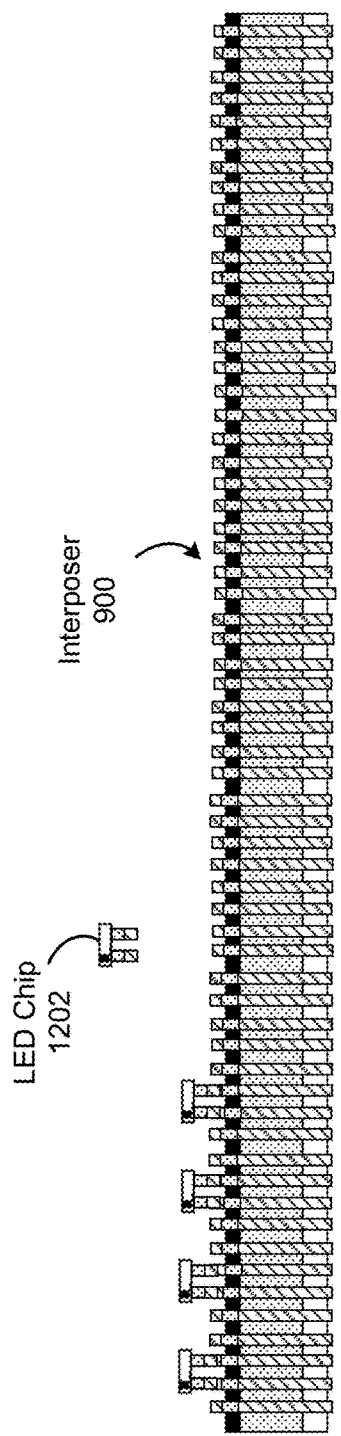
FIGS. 12A, 12B, and 12C illustrate an assembly of the multilayer structure of FIG. 10, in accordance with one embodiment.

LED chips, an interposer, and a control circuitry layer are fabricated 1105 in separate processes. Each device layer and interposer may be separately fabricated using different substrates and then bonded together. With reference to FIG. 12A, the LED chips 1202 may be individually packaged LEDs including contacts that are bonded to the conductive pillars (or in some embodiments, contacts or interface contacts) of the interposer 900. In some embodiments, the LED chips 1202 are micro-LEDs. The control circuitry layer 1006 includes control circuits that control each of the LED chips 1202. Fabricating the LED chips, interposer, and control circuitry layer may include forming bonding layers on each of the LED chips, interposer, and control circuitry layer to mitigate thermal expansion that would otherwise be caused by different interface materials.

The LED chips are placed 1110 on the interposer. As shown in FIG. 12A, the LED chips 1202 placed on the interposer 900 with the contacts of each LED chip aligned to contacts of the interposer 900. In some embodiments, each LED chip 1202 includes a polymeric material on a side with contacts that forms the polymeric layer 1002 of the LED layer 1010 when the LED chips 1202 are placed on the interposer 900.

Figure 12B:
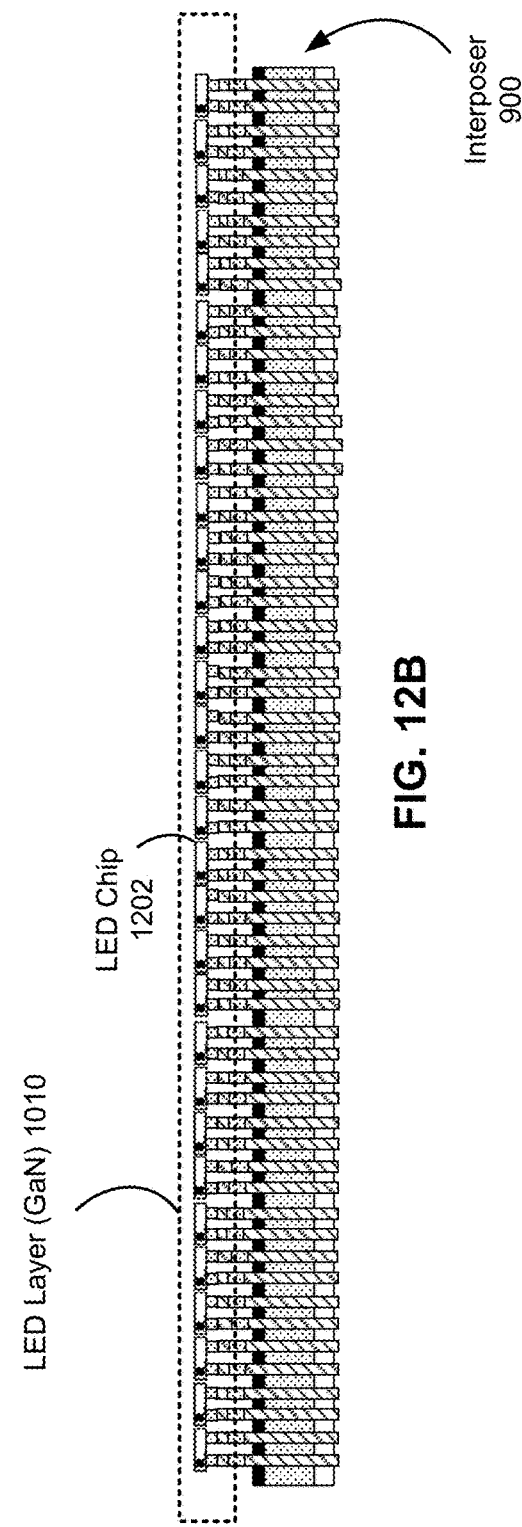

The LED chips are bonded 1115 to the interposer using a hybrid bonding process to form an LED layer bonded to the interposer. The hybrid bonding process may include bonding the contacts of the interposer 900 with the contacts of the LED chips 1202, and bonding the polymeric layer 906 of the interposer 900 with the polymeric material of the LED chips 1102. With reference to FIG. 12B, the LED chips 1202 form the LED layer 1010 when bonded to the interposer 900.

Figure 12C:
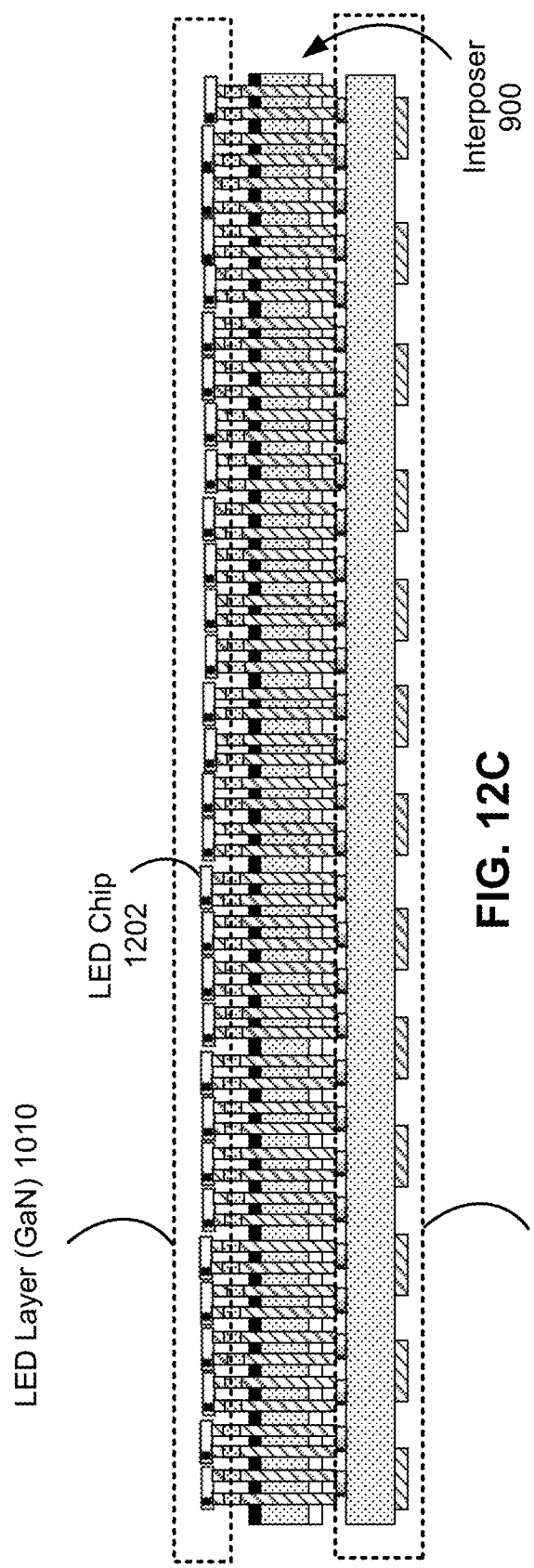

The interposer including the bonded LED layer is bonded 1120 with the control circuitry layer using a hybrid bonding process. With reference to FIG. 12C, the interposer 900, including the bonded LED layer 1010, is bonded with the control circuitry layer 1006. The hybrid bonding process may be used to bond the contacts of the interposer 900 with the contacts of the control circuitry layer 1006, and further to bond the dielectric layer 910 of the interposer 900 with a dielectric layer of the control circuitry layer 1006.

In some embodiments, the hybrid bonding processes may include a low temperature assembly process may be used to join two devices together using the electrical interconnect pathways. Electrical interconnects to be made over a large area without the misalignment effects normally associated with the thermal expansion properties of two dissimilar materials being joined by using bonding layers. Reducing the temperature profile also improves the ability to bond dissimilar materials over a larger surface area.

In process 1100, the interposer 900 is bonded to the LED chips 1202 in a first hybrid bonding process, and the interposer 900 is bonded to the control circuitry layer 1006 in a second hybrid bonding process. The first and second bonding processes may be at different temperatures. For example, the bonding of contacts and polymeric layers at the interface of the interposer 900 and the LED layer 1010 can be performed at a higher temperature than the bonding of contacts and dielectric layers at the interface of the interposer 900 and the control circuitry layer 1006. In some embodiments, a single hybrid bonding process is used to bond the interposer 900 to the LED chips 1202 and the control circuitry layer 1006. In some embodiments, the control circuitry layer 1006 is bonded to the interposer 900 prior to bonding the LED chips 1202 to the interposer 900.

Process 1100 may be used to join adjacent device layers of different properties or types. For example, process 1100 may also be used to join the interposer 404 with the control circuitry layer 406 and the driver circuitry layer 402.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An electronic display, comprising:
   a light emitting diode (LED) layer including LED chips;
   a control circuitry layer to provide analog signals to the LED chips;
   first interposer between the LED layer and the control circuitry layer, the first interposer including:
      a substrate with a first surface facing the LED layer and a second surface facing the control circuitry layer;
      an array of conductive pillars extending through the substrate from the first surface to the second surface, first ends of the conductive pillars bonded with contacts of the LED chips and second ends of the conductive pillars bonded with contacts of the control circuitry layer to electrically connect the LED layer with the control circuitry layer;
   a driver circuitry layer to provide digital signals to the control circuitry layer; and
   a second interposer positioned between the control circuitry layer and the driver circuitry layer, the second interposer including a second array of conductive pillars that electrically connect the control circuitry layer with the driver circuitry layer.

2. The electronic display of claim 1, wherein the first interposer includes an insulating material surrounding each of the conductive pillars to electrically isolate the substrate and the conductive pillars.

3. The electronic display of claim 1, wherein each conductive pillar includes carbon nanotube filaments.

4. The electronic display of claim 1, wherein the first interposer further includes a redistribution layer at the second surface of the substrate to connect the second end of the conductive pillars to the contacts of the control circuitry layer.

5. The electronic display of claim 1, wherein the first end of each conductive pillar includes an interface contact bonded with the contacts of the LED chips, the interface contact being formed from a conductive material different than the conductive pillars.

6. A method for manufacturing an electronic display, comprising:
   placing light emitting diode (LED) chips on a first surface of a first substrate of a first interposer to connect first contacts of the LED chips with first ends of first conductive pillars extending through the first substrate from the first surface to a second surface of the first interposer;

placing a control circuitry layer that provides analog signals to the LED chips on the first interposer facing the second surface of the first substrate to connect second contacts of the control circuitry layer with second ends of the first conductive pillars;

bonding the control circuitry layer and the LED chips to the first interposer, the first end of the first conductive pillars being bonded with the first contacts of the LED chips and the second end of the first conductive pillars being bonded with the second contacts of the control circuitry layer to electrically connect the LED chips with the control circuitry layer;

placing third contacts of the control circuitry layer on a third surface of a second substrate of a second interposer to connect the third contacts of the control circuitry layer with third ends of second conductive pillars extending through the second substrate from the third surface to a fourth surface of the second interposer;

placing a driver circuitry layer that provides digital signals to the control circuitry layer on the second interposer facing the fourth surface of the second substrate to connect fourth contacts of the driver circuitry layer with fourth ends of the second conductive pillars; and bonding the control circuitry layer and the driver circuitry layer to the second interposer, the third ends of the second conductive pillars being bonded with the third contacts of the control circuitry layer and the fourth ends of the second conductive pillars being bonded with the fourth contacts of the driver circuitry layer to electrically connect the control circuitry layer with the driver circuitry layer.

7. The method of claim 6, further comprising fabricating the first interposer by:
depositing a metal layer on the first surface or the second surface of the first substrate;
patterning the metal layer into an array of conductive dots;
etching the first substrate using the conductive dots as a catalyst to form an array of pillar regions in the substrate; and
forming the first conductive pillars in the pillar regions.

8. The method of claim 7, wherein the first interposer is fabricated by coating walls of the pillar regions with an insulating material prior to forming the first conductive pillars in the pillar regions.

9. The method of claim 8, further comprising, subsequent to forming the first conductive pillars, removing a portion of the substrate opposite the first surface or second surface where the metal layer was deposited.

10. The method of claim 6, further comprising fabricating the first interposer includes by:
laser drilling or plasma etching the first substrate to form an array of pillar regions in the first substrate; and
forming the first conductive pillars in the pillar regions.

11. The method of claim 6, further comprising:
fabricating the first interposer by:
forming a first bonding layer on the first surface of the first substrate between the first ends of the first conductive pillars; and
forming fifth contacts at the first end of the first conductive pillars; and
fabricating each LED chip by forming a second bonding layer between the first contacts of the LED chips; and
wherein bonding the LED chips to the first interposer includes using a hybrid bonding process to bond the fifth contacts at the first end of the first conductive pillars with the first contacts of the LED chips and to bond the first bonding layer with the second bonding layer.

12. The method of claim 11, wherein the first and second bonding layers include a polymeric material.

13. The method of claim 6, further comprising:
fabricating the first interposer by:
forming a first bonding layer on the second surface of the first substrate between the second ends of the first conductive pillars;
forming fifth contacts at the second ends of the first conductive pillars;
fabricating the control circuitry layer by forming a second bonding layer between the second contacts of the control circuitry layer; and
wherein bonding the control circuitry layer to the first interposer includes using a hybrid bonding process to bond the fifth contacts at the second ends of the first conductive pillars with the second contacts of the control circuitry layer and to bond the first bonding layer with the second bonding layer.

14. The method of claim 13, wherein the first and second bonding layers include a dielectric material.

15. An electronic device, comprising:
a first device layer;
a second device layer to provide analog signals to the first device layer;
a first interposer between the first device layer and the second device layer, the first interposer including:
a substrate including a first surface facing the first device layer and a second surface facing the second device layer; and
an array of conductive pillars extending through the substrate from the first surface to the second surface, first ends of the conductive pillars bonded with contacts of the first device layer and second ends of the conductive pillars bonded with contacts of the second device layer to electrically connect the first device layer with the second device layer;
a third device layer to provide digital signals to the second device layer; and
a second interposer positioned between the second device layer and the third device layer, the second interposer including a second array of conductive pillars that electrically connect the second device layer with the third device layer.

16. The electronic display of claim 1, wherein:
the first interposer includes a first bonding layer formed on the first surface of the substrate between the first end of the conductive pillars;
the LED layer includes a second bonding layer formed between the contacts of the LED chips; and
the first bonding layer and the second bonding layer are bonded to each other to mechanically attach the LED layer to the first interposer.

17. The electronic display of claim 16, wherein the first and second bonding layers include a polymeric material.

18. The electronic display of claim 16, wherein:
the first interposer includes a third bonding layer between the second end of the conductive pillars on the second surface of the substrate;
the control circuitry layer includes a fourth bonding layer between the contacts of the control circuitry layer; and
the third bonding layer is bonded to the fourth bonding layer to mechanically attach the control circuitry layer to the first interposer.

19. The electronic display of claim 18, wherein the third and fourth bonding layers include a dielectric material.

* * * * *